United States Patent
Sarigiannis et al.

(10) Patent No.: US 7,282,239 B2
(45) Date of Patent: Oct. 16, 2007

(54) SYSTEMS AND METHODS FOR DEPOSITING MATERIAL ONTO MICROFEATURE WORKPIECES IN REACTION CHAMBERS

(75) Inventors: Demetrius Sarigiannis, Boise, ID (US); Shuang Meng, Boise, ID (US); Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 558 days.

(21) Appl. No.: 10/665,908

(22) Filed: Sep. 18, 2003

(65) Prior Publication Data
US 2005/0061243 A1    Mar. 24, 2005

(51) Int. Cl.
*C23C 16/00* (2006.01)

(52) U.S. Cl. .................................. 427/248.1; 118/715
(58) Field of Classification Search ...................... None
See application file for complete search history.

(56) References Cited

U.S. PATENT DOCUMENTS

| | | |
|---|---|---|
| 579,269 A | 3/1897 | Hent |
| 3,618,919 A | 11/1971 | Beck |
| 3,620,934 A | 11/1971 | Endle |
| 3,630,769 A | 12/1971 | Hart et al. |
| 3,630,881 A | 12/1971 | Lester et al. |
| 3,634,212 A | 1/1972 | Valayll et al. |
| 4,018,949 A | 4/1977 | Donakowski et al. |
| 4,242,182 A | 12/1980 | Popescu |
| 4,269,625 A | 5/1981 | Molenaar |
| 4,289,061 A | 9/1981 | Emmett |
| 4,313,783 A | 2/1982 | Davies et al. |
| 4,397,753 A | 8/1983 | Czaja |
| 4,438,724 A | 3/1984 | Doehler et al. |
| 4,469,801 A | 9/1984 | Hirai et al. |
| 4,509,456 A | 4/1985 | Kleinert et al. |
| 4,545,136 A | 10/1985 | Izu et al. |
| 4,590,042 A | 5/1986 | Drage |
| 4,593,644 A | 6/1986 | Hanak |
| 4,681,777 A | 7/1987 | Engelken et al. |
| 4,826,579 A | 5/1989 | Westfall |

(Continued)

FOREIGN PATENT DOCUMENTS

DE    198 51 824 A1    5/2000

(Continued)

OTHER PUBLICATIONS

U.S. Appl. No. 10/767,298, filed Jan. 28, 2004, Zheng et al.

(Continued)

*Primary Examiner*—Timothy Meeks
*Assistant Examiner*—Kelly M Stouffer
(74) *Attorney, Agent, or Firm*—Perkins Coie LLP

(57) ABSTRACT

In one embodiment, the system includes a gas supply assembly having a first gas source, a first gas conduit coupled to the first gas source, a first valve assembly, a reaction chamber, and a gas distributor carried by the reaction chamber. The first valve assembly includes first and second valves that are in fluid communication with the first gas conduit. The first and second valves are configured in a parallel arrangement so that the first gas flows through the first valve and/or the second valve.

6 Claims, 3 Drawing Sheets

U.S. PATENT DOCUMENTS

| | | |
|---|---|---|
| 4,911,638 A | 3/1990 | Bayne et al. |
| 4,923,715 A | 5/1990 | Matsuda et al. |
| 4,948,979 A | 8/1990 | Munakata et al. |
| 4,949,669 A | 8/1990 | Ishii et al. |
| 4,966,646 A | 10/1990 | Zdeblick |
| 4,977,106 A | 12/1990 | Smith |
| 5,015,330 A | 5/1991 | Okumura et al. |
| 5,017,404 A | 5/1991 | Paquet et al. |
| 5,020,476 A | 6/1991 | Bay et al. |
| 5,076,205 A | 12/1991 | Vowles et al. |
| 5,090,985 A | 2/1992 | Soubeyrand |
| 5,091,207 A | 2/1992 | Tanaka |
| 5,131,752 A | 7/1992 | Yu et al. |
| 5,136,975 A | 8/1992 | Bartholomew et al. |
| 5,172,849 A | 12/1992 | Barten et al. |
| 5,200,023 A | 4/1993 | Gifford et al. |
| 5,223,113 A | 6/1993 | Kaneko et al. |
| 5,232,749 A | 8/1993 | Gilton |
| 5,248,527 A | 9/1993 | Uchida et al. |
| 5,325,020 A | 6/1994 | Campbell et al. |
| 5,364,219 A | 11/1994 | Takahashi et al. |
| 5,366,557 A | 11/1994 | Yu |
| 5,377,429 A | 1/1995 | Sandhu et al. |
| 5,380,396 A | 1/1995 | Shikida et al. |
| 5,409,129 A | 4/1995 | Tsukada et al. |
| 5,418,180 A | 5/1995 | Brown |
| 5,427,666 A | 6/1995 | Mueller et al. |
| 5,433,787 A | 7/1995 | Suzuki et al. |
| 5,433,835 A | 7/1995 | Demaray et al. |
| 5,445,491 A | 8/1995 | Nakagawa et al. |
| 5,480,818 A | 1/1996 | Matsumoto et al. |
| 5,498,292 A | 3/1996 | Ozaki |
| 5,500,256 A | 3/1996 | Watabe |
| 5,522,934 A | 6/1996 | Suzuki et al. |
| 5,536,317 A | 7/1996 | Crain et al. |
| 5,562,800 A | 10/1996 | Kawamura et al. |
| 5,575,883 A | 11/1996 | Nishikawa |
| 5,589,002 A | 12/1996 | Su |
| 5,592,581 A | 1/1997 | Okase |
| 5,595,606 A | 1/1997 | Fujikawa et al. |
| 5,599,513 A | 2/1997 | Masaki et al. |
| 5,624,498 A | 4/1997 | Lee et al. |
| 5,626,936 A | 5/1997 | Alderman |
| 5,640,751 A | 6/1997 | Faria |
| 5,643,394 A | 7/1997 | Maydan et al. |
| 5,654,589 A | 8/1997 | Huang et al. |
| 5,693,288 A | 12/1997 | Nakamura |
| 5,729,896 A | 3/1998 | Dalal et al. |
| 5,746,434 A | 5/1998 | Boyd et al. |
| 5,766,364 A | 6/1998 | Ishida et al. |
| 5,769,950 A | 6/1998 | Takasu et al. |
| 5,769,952 A | 6/1998 | Komino |
| 5,788,778 A | 8/1998 | Shang et al. |
| 5,792,269 A | 8/1998 | Deacon et al. |
| 5,792,700 A | 8/1998 | Turner et al. |
| 5,819,683 A | 10/1998 | Ikeda et al. |
| 5,820,641 A | 10/1998 | Gu et al. |
| 5,827,370 A | 10/1998 | Gu |
| 5,833,888 A | 11/1998 | Arya et al. |
| 5,846,275 A | 12/1998 | Lane et al. |
| 5,846,330 A | 12/1998 | Quirk et al. |
| 5,851,849 A | 12/1998 | Comizzoli et al. |
| 5,865,417 A | 2/1999 | Harris et al. |
| 5,866,986 A | 2/1999 | Pennington |
| 5,879,459 A | 3/1999 | Gadgil et al. |
| 5,885,425 A | 3/1999 | Hsieh et al. |
| 5,895,530 A | 4/1999 | Shrotriya et al. |
| 5,902,403 A | 5/1999 | Aitani et al. |
| 5,908,947 A | 6/1999 | Vaartstra |
| 5,932,286 A | 8/1999 | Beinglass et al. |
| 5,953,634 A | 9/1999 | Kajita et al. |
| 5,956,613 A | 9/1999 | Zhao et al. |
| 5,968,587 A | 10/1999 | Frankel |
| 5,972,430 A | 10/1999 | DiMeo, Jr. et al. |
| 5,994,181 A | 11/1999 | Hsieh et al. |
| 5,997,588 A | 12/1999 | Goodwin et al. |
| 6,006,694 A | 12/1999 | DeOrnellas et al. |
| 6,008,086 A | 12/1999 | Schuegraf et al. |
| 6,022,483 A | 2/2000 | Aral |
| 6,032,923 A | 3/2000 | Biegelsen et al. |
| 6,042,652 A | 3/2000 | Hyun et al. |
| 6,045,620 A | 4/2000 | Tepman et al. |
| 6,059,885 A | 5/2000 | Ohashi et al. |
| 6,062,256 A | 5/2000 | Miller et al. |
| 6,070,551 A | 6/2000 | Li et al. |
| 6,079,426 A | 6/2000 | Subrahmanyam et al. |
| 6,080,446 A | 6/2000 | Tobe et al. |
| 6,086,677 A | 7/2000 | Umotoy et al. |
| 6,089,543 A | 7/2000 | Freerks |
| 6,109,206 A | 8/2000 | Maydan et al. |
| 6,113,698 A | 9/2000 | Raaijmakers et al. |
| 6,123,107 A | 9/2000 | Selser et al. |
| 6,129,331 A | 10/2000 | Henning et al. |
| 6,139,700 A | 10/2000 | Kang et al. |
| 6,142,163 A * | 11/2000 | McMillin et al. ............. 137/14 |
| 6,143,077 A | 11/2000 | Ikeda et al. |
| 6,143,078 A | 11/2000 | Ishikawa et al. |
| 6,143,659 A | 11/2000 | Leem |
| 6,144,060 A | 11/2000 | Park et al. |
| 6,149,123 A | 11/2000 | Harris et al. |
| 6,159,298 A | 12/2000 | Saito |
| 6,160,243 A | 12/2000 | Cozad |
| 6,161,500 A | 12/2000 | Kopacz et al. |
| 6,173,673 B1 | 1/2001 | Golovato et al. |
| 6,174,366 B1 | 1/2001 | Ihantola |
| 6,174,377 B1 | 1/2001 | Doering et al. |
| 6,174,809 B1 | 1/2001 | Kang et al. |
| 6,178,660 B1 | 1/2001 | Emmi et al. |
| 6,182,603 B1 | 2/2001 | Shang et al. |
| 6,192,827 B1 | 2/2001 | Welch et al. |
| 6,193,802 B1 | 2/2001 | Pang et al. |
| 6,194,628 B1 | 2/2001 | Pang et al. |
| 6,197,119 B1 | 3/2001 | Dozoretz et al. |
| 6,200,415 B1 | 3/2001 | Maraschin |
| 6,203,613 B1 | 3/2001 | Gates et al. |
| 6,206,967 B1 | 3/2001 | Mak et al. |
| 6,206,972 B1 | 3/2001 | Dunham |
| 6,207,937 B1 | 3/2001 | Stoddard et al. |
| 6,210,754 B1 | 4/2001 | Lu et al. |
| 6,211,033 B1 | 4/2001 | Sandhu et al. |
| 6,211,078 B1 | 4/2001 | Matthews |
| 6,214,714 B1 | 4/2001 | Wang et al. |
| 6,237,394 B1 | 5/2001 | Harris et al. |
| 6,237,529 B1 | 5/2001 | Spahn |
| 6,245,192 B1 * | 6/2001 | Dhindsa et al. ........ 156/345.34 |
| 6,251,190 B1 | 6/2001 | Mak et al. |
| 6,255,222 B1 | 7/2001 | Xia et al. |
| 6,263,829 B1 | 7/2001 | Schneider et al. |
| 6,270,572 B1 | 8/2001 | Kim et al. |
| 6,273,954 B2 | 8/2001 | Nishikawa et al. |
| 6,277,763 B1 | 8/2001 | Kugimiya et al. |
| 6,280,584 B1 | 8/2001 | Kumar et al. |
| 6,287,965 B1 | 9/2001 | Kang et al. |
| 6,287,980 B1 | 9/2001 | Hanazaki et al. |
| 6,290,491 B1 | 9/2001 | Shahvandi et al. |
| 6,291,337 B1 | 9/2001 | Sidhwa |
| 6,294,394 B1 | 9/2001 | Erickson et al. |
| 6,297,539 B1 | 10/2001 | Ma et al. |
| 6,302,964 B1 | 10/2001 | Umotoy et al. |
| 6,302,965 B1 | 10/2001 | Umotoy et al. |
| 6,303,953 B1 | 10/2001 | Doan et al. |
| 6,305,314 B1 | 10/2001 | Sneh et al. |
| 6,309,161 B1 | 10/2001 | Hofmeister |
| 6,315,859 B1 | 11/2001 | Donohoe |

| | | |
|---|---|---|
| 6,328,803 B2 | 12/2001 | Rolfson et al. |
| 6,329,297 B1 | 12/2001 | Balish et al. |
| 6,333,272 B1 * | 12/2001 | McMillin et al. ........... 438/710 |
| 6,334,928 B1 | 1/2002 | Sekine et al. |
| 6,342,277 B1 | 1/2002 | Sherman |
| 6,346,477 B1 | 2/2002 | Kaloyeros et al. |
| 6,347,602 B2 | 2/2002 | Goto et al. |
| 6,347,918 B1 | 2/2002 | Blahnik |
| 6,355,561 B1 | 3/2002 | Sandhu et al. |
| 6,358,323 B1 | 3/2002 | Schmitt et al. |
| 6,364,219 B1 | 4/2002 | Zimmerman et al. |
| 6,374,831 B1 | 4/2002 | Chandran et al. |
| 6,383,300 B1 | 5/2002 | Saito et al. |
| 6,387,185 B2 | 5/2002 | Doering et al. |
| 6,387,207 B1 | 5/2002 | Janakiraman et al. |
| 6,402,806 B1 | 6/2002 | Schmitt et al. |
| 6,402,849 B2 | 6/2002 | Kwag et al. |
| 6,415,736 B1 | 7/2002 | Hao et al. |
| 6,419,462 B1 | 7/2002 | Horie et al. |
| 6,420,230 B1 | 7/2002 | Derderian et al. |
| 6,420,742 B1 | 7/2002 | Ahn et al. |
| 6,425,168 B1 | 7/2002 | Takaku |
| 6,428,859 B1 | 8/2002 | Chiang et al. |
| 6,432,256 B1 | 8/2002 | Raoux |
| 6,432,259 B1 | 8/2002 | Noorbakhsh et al. |
| 6,432,831 B2 | 8/2002 | Dhindsa et al. |
| 6,435,865 B1 | 8/2002 | Tseng et al. |
| 6,444,039 B1 | 9/2002 | Nguyen |
| 6,450,117 B1 | 9/2002 | Murugesh et al. |
| 6,451,119 B2 | 9/2002 | Sneh et al. |
| 6,458,416 B1 | 10/2002 | Derderian et al. |
| 6,461,436 B1 | 10/2002 | Campbell et al. |
| 6,461,931 B1 | 10/2002 | Eldridge |
| 6,503,330 B1 | 1/2003 | Sneh et al. |
| 6,506,254 B1 | 1/2003 | Bosch et al. |
| 6,509,280 B2 | 1/2003 | Choi |
| 6,534,007 B1 | 3/2003 | Blonigan et al. |
| 6,534,395 B2 | 3/2003 | Werkhoven et al. |
| 6,540,838 B2 | 4/2003 | Sneh et al. |
| 6,541,353 B1 | 4/2003 | Sandhu et al. |
| 6,551,929 B1 | 4/2003 | Kori et al. |
| 6,562,140 B1 | 5/2003 | Bondestam et al. |
| 6,562,141 B2 | 5/2003 | Clarke |
| 6,573,184 B2 | 6/2003 | Park |
| 6,579,372 B2 | 6/2003 | Park |
| 6,579,374 B2 | 6/2003 | Bondestam et al. |
| 6,585,823 B1 | 7/2003 | Van Wijck |
| 6,596,085 B1 | 7/2003 | Schmitt et al. |
| 6,602,346 B1 | 8/2003 | Gochberg |
| 6,622,104 B2 | 9/2003 | Wang et al. |
| 6,630,201 B2 | 10/2003 | Chiang et al. |
| 6,635,965 B1 | 10/2003 | Lee et al. |
| 6,638,672 B2 | 10/2003 | Deguchi |
| 6,638,879 B2 | 10/2003 | Hsieh et al. |
| 6,641,673 B2 | 11/2003 | Yang |
| 6,656,282 B2 | 12/2003 | Kim et al. |
| 6,663,713 B1 | 12/2003 | Robles et al. |
| 6,666,982 B2 | 12/2003 | Brcka |
| 6,673,196 B1 | 1/2004 | Oyabu |
| 6,686,594 B2 | 2/2004 | Ji et al. |
| 6,689,220 B1 | 2/2004 | Nguyen |
| 6,704,913 B2 | 3/2004 | Rossman |
| 6,705,345 B1 | 3/2004 | Bifano |
| 6,706,334 B1 | 3/2004 | Kobayashi et al. |
| 6,716,284 B2 | 4/2004 | Campbell et al. |
| 6,758,911 B2 | 7/2004 | Campbell et al. |
| 6,770,145 B2 | 8/2004 | Saito et al. |
| 6,773,507 B2 | 8/2004 | Jallepally et al. |
| 6,787,463 B2 | 9/2004 | Mardian et al. |
| 6,800,172 B2 | 10/2004 | Carpenter et al. |
| 6,807,971 B2 | 10/2004 | Saito et al. |
| 6,814,813 B2 | 11/2004 | Dando et al. |
| 6,818,249 B2 | 11/2004 | Derderian |
| 6,820,570 B2 | 11/2004 | Kilpela et al. |
| 6,821,347 B2 | 11/2004 | Carpenter et al. |
| 6,838,114 B2 | 1/2005 | Carpenter et al. |
| 6,849,131 B2 | 2/2005 | Chen et al. |
| 6,858,264 B2 | 2/2005 | Carpenter et al. |
| 6,861,094 B2 | 3/2005 | Derderian et al. |
| 6,869,500 B2 | 3/2005 | Lee et al. |
| 6,881,295 B2 | 4/2005 | Nagakura et al. |
| 6,884,296 B2 | 4/2005 | Basceri et al. |
| 6,887,521 B2 | 5/2005 | Basceri |
| 6,890,386 B2 | 5/2005 | DeDontney et al. |
| 6,905,547 B1 * | 6/2005 | Londergan et al. ......... 118/715 |
| 6,905,549 B2 | 6/2005 | Okuda et al. |
| 6,916,398 B2 | 7/2005 | Chen et al. |
| 7,086,410 B2 * | 8/2006 | Chouno et al. ............... 137/14 |
| 2001/0010309 A1 | 8/2001 | Van Bilsen |
| 2001/0011526 A1 | 8/2001 | Doering et al. |
| 2001/0012697 A1 | 8/2001 | Mikata |
| 2001/0024387 A1 | 9/2001 | Raaijmakers et al. |
| 2001/0029892 A1 | 10/2001 | Cook et al. |
| 2001/0045187 A1 | 11/2001 | Uhlenbrock |
| 2001/0050267 A1 | 12/2001 | Hwang et al. |
| 2001/0054484 A1 | 12/2001 | Komino |
| 2002/0000202 A1 | 1/2002 | Yuda et al. |
| 2002/0007790 A1 | 1/2002 | Park |
| 2002/0020353 A1 | 2/2002 | Redemann et al. |
| 2002/0042205 A1 * | 4/2002 | McMillin et al. ........... 438/710 |
| 2002/0043216 A1 | 4/2002 | Hwang et al. |
| 2002/0052097 A1 | 5/2002 | Park |
| 2002/0073924 A1 | 6/2002 | Chiang et al. |
| 2002/0076490 A1 | 6/2002 | Chiang et al. |
| 2002/0076507 A1 | 6/2002 | Chiang et al. |
| 2002/0076508 A1 | 6/2002 | Chiang et al. |
| 2002/0094689 A1 | 7/2002 | Park |
| 2002/0100418 A1 | 8/2002 | Sandhu et al. |
| 2002/0104481 A1 | 8/2002 | Chiang et al. |
| 2002/0108714 A1 | 8/2002 | Doering et al. |
| 2002/0110991 A1 | 8/2002 | Li |
| 2002/0127745 A1 | 9/2002 | Lu et al. |
| 2002/0129768 A1 | 9/2002 | Carpenter et al. |
| 2002/0132374 A1 | 9/2002 | Basceri et al. |
| 2002/0144655 A1 | 10/2002 | Chiang et al. |
| 2002/0146512 A1 | 10/2002 | Rossman |
| 2002/0162506 A1 | 11/2002 | Sneh et al. |
| 2002/0164420 A1 | 11/2002 | Derderian et al. |
| 2002/0185067 A1 | 12/2002 | Upham |
| 2002/0195056 A1 | 12/2002 | Sandhu et al. |
| 2002/0195201 A1 | 12/2002 | Beer |
| 2002/0197402 A1 | 12/2002 | Chiang et al. |
| 2003/0000473 A1 | 1/2003 | Chae et al. |
| 2003/0003697 A1 | 1/2003 | Agarwal et al. |
| 2003/0003730 A1 | 1/2003 | Li |
| 2003/0013320 A1 | 1/2003 | Kim et al. |
| 2003/0023338 A1 | 1/2003 | Chin et al. |
| 2003/0024477 A1 | 2/2003 | Okuda et al. |
| 2003/0027428 A1 | 2/2003 | Ng et al. |
| 2003/0027431 A1 | 2/2003 | Sneh et al. |
| 2003/0037729 A1 | 2/2003 | DeDontney et al. |
| 2003/0037730 A1 | 2/2003 | Yamasaki et al. |
| 2003/0049372 A1 | 3/2003 | Cook et al. |
| 2003/0060030 A1 | 3/2003 | Lee et al. |
| 2003/0066483 A1 | 4/2003 | Lee et al. |
| 2003/0070609 A1 | 4/2003 | Campbell et al. |
| 2003/0070617 A1 | 4/2003 | Kim et al. |
| 2003/0070618 A1 | 4/2003 | Campbell et al. |
| 2003/0075273 A1 | 4/2003 | Kilpela et al. |
| 2003/0079686 A1 | 5/2003 | Chen et al. |
| 2003/0098372 A1 | 5/2003 | Kim |
| 2003/0098419 A1 | 5/2003 | Ji et al. |
| 2003/0106490 A1 | 6/2003 | Jallepally et al. |
| 2003/0121608 A1 | 7/2003 | Chen et al. |
| 2003/0159780 A1 | 8/2003 | Carpenter et al. |
| 2003/0192645 A1 | 10/2003 | Liu |

| | | | |
|---|---|---|---|
| 2003/0194862 A1 | 10/2003 | Mardian et al. | |
| 2003/0200923 A1 | 10/2003 | Dando et al. | |
| 2003/0203109 A1 | 10/2003 | Dando et al. | |
| 2003/0213435 A1 | 11/2003 | Okuda et al. | |
| 2004/0000270 A1 | 1/2004 | Carpenter et al. | |
| 2004/0003777 A1 | 1/2004 | Carpenter et al. | |
| 2004/0007188 A1 | 1/2004 | Burkhart et al. | |
| 2004/0025786 A1 | 2/2004 | Kontani et al. | |
| 2004/0035358 A1 | 2/2004 | Basceri et al. | |
| 2004/0040502 A1 | 3/2004 | Basceri et al. | |
| 2004/0040503 A1 | 3/2004 | Basceri et al. | |
| 2004/0083959 A1 | 5/2004 | Carpenter et al. | |
| 2004/0083960 A1 | 5/2004 | Dando | |
| 2004/0083961 A1 | 5/2004 | Basceri | |
| 2004/0089240 A1 | 5/2004 | Dando et al. | |
| 2004/0099377 A1 | 5/2004 | Newton et al. | |
| 2004/0124131 A1 | 7/2004 | Aitchison et al. | |
| 2004/0154538 A1 | 8/2004 | Carpenter et al. | |
| 2004/0226507 A1 | 11/2004 | Carpenter et al. | |
| 2004/0238123 A1 | 12/2004 | Becknell et al. | |
| 2005/0016956 A1 | 1/2005 | Liu et al. | |
| 2005/0016984 A1 | 1/2005 | Dando | |
| 2005/0022739 A1 | 2/2005 | Carpenter et al. | |
| 2005/0028734 A1 | 2/2005 | Carpenter et al. | |
| 2005/0039680 A1 | 2/2005 | Beamen et al. | |
| 2005/0039686 A1 | 2/2005 | Zheng et al. | |
| 2005/0045100 A1 | 3/2005 | Derderian | |
| 2005/0045102 A1 | 3/2005 | Zheng et al. | |
| 2005/0059261 A1 | 3/2005 | Basceri et al. | |
| 2005/0061243 A1 | 3/2005 | Sarigiannis et al. | |
| 2005/0126489 A1 | 6/2005 | Beaman et al. | |
| 2005/0217582 A1 | 10/2005 | Kim et al. | |
| 2006/0134345 A1 | 6/2006 | Rueger et al. | |
| 2006/0165873 A1 | 7/2006 | Rueger et al. | |
| 2006/0204649 A1 | 9/2006 | Beaman et al. | |
| 2006/0205187 A1 | 9/2006 | Zheng et al. | |
| 2006/0213440 A1 | 9/2006 | Zheng et al. | |
| 2006/0237138 A1 | 10/2006 | Qin | |

FOREIGN PATENT DOCUMENTS

| | | |
|---|---|---|
| EP | 1 167 569 A1 | 1/2002 |
| JP | 63-111177 A | 5/1988 |
| JP | 63-256460 A | 10/1988 |
| JP | 64-81311 A | 3/1989 |
| JP | 1-273991 A | 11/1989 |
| JP | 4-100533 A | 4/1992 |
| JP | 4-213818 A | 8/1992 |
| JP | 6-151558 A | 5/1994 |
| JP | 06-201539 | 7/1994 |
| JP | 8-34678 A | 2/1996 |
| JP | 9-82650 A | 3/1997 |
| JP | 63-020490 A | 1/1998 |
| JP | 10-223719 A | 8/1998 |
| JP | 11-172438 A | 6/1999 |
| JP | 2001-82682 A | 3/2001 |
| JP | 6-342785 A | 9/2001 |
| JP | 2001-261375 A | 9/2001 |
| JP | 2002-164336 A | 6/2002 |
| JP | 2001-254181 A | 9/2002 |
| SU | 598630 | 3/1978 |
| WO | WO-98/37258 A1 | 8/1998 |
| WO | WO-99/06610 A1 | 2/1999 |
| WO | WO-00/40772 A1 | 7/2000 |
| WO | WO-00/63952 A1 | 10/2000 |
| WO | WO-00/65649 A1 | 11/2000 |
| WO | WO-00/79019 A1 | 12/2000 |
| WO | WO-01/32966 A1 | 5/2001 |
| WO | WO-01/46490 A1 | 6/2001 |
| WO | WO-02/45871 A1 | 6/2002 |
| WO | WO-02/48427 A1 | 6/2002 |
| WO | WO-02/073329 A2 | 9/2002 |
| WO | WO-02/073660 A2 | 9/2002 |
| WO | WO-02/081771 A2 | 10/2002 |
| WO | WO-02/095807 A2 | 11/2002 |
| WO | WO-03/008662 A2 | 1/2003 |
| WO | WO-03/016587 A1 | 2/2003 |
| WO | WO-03/028069 A2 | 4/2003 |
| WO | WO-03/033762 A1 | 4/2003 |
| WO | WO-03/035927 A2 | 5/2003 |
| WO | WO-03/052807 A1 | 6/2003 |

OTHER PUBLICATIONS

U.S. Appl. No. 11/027,825, filed Dec. 29, 2004, Derderian et al.
U.S. Appl. No. 10/933,604, filed Sep. 2, 2004, Carpenter et al.
U.S. Appl. No. 10/687,458, filed Oct. 15, 2003, Kubista et al.
U.S. Appl. No. 10/683,424, filed Oct. 10, 2003, Mardian.
U.S. Appl. No. 10/839,316, filed May 5, 2004, Saragiannis et al.
U.S. Appl. No. 10/814,573, filed Mar. 31, 2004, Gealy et al.
U.S. Appl. No. 11/043,629, filed Jan. 25, 2005, Rueger et al.
U.S. Appl. No. 11/018,142, filed Dec. 20, 2004, Rueger et al.
U.S. Appl. No. 10/840,571, filed May 6, 2004, Dando et al.
U.S. Appl. No. 10/859,883, filed Jun. 2, 2004, Miller et al.
U.S. Appl. No. 10/683,606, filed Oct. 9, 2003, Derderian.
U.S. Appl. No. 11/027,809, filed Dec. 29, 2004, Carpenter et al.
U.S. Appl. 09/651,037, filed Aug. 30, 2000, Mardian.
U.S. Appl. No. 10/365,085, filed Feb. 11, 2003, Carpenter et al.
U.S. Appl. No. 10/733,523, filed Dec. 10, 2003, Beaman et al.
Integrated Process Systems Ltd., "ALD & CVD", 2 pages, retrieved from the Internet on Dec. 11, 2001, <http://www.lps-tech.com/eng/pro-p2-2.htm>.
Deublin Company, "Rotating Unions", 1 page, retrieved from the Internet of Feb. 4, 2002, <http://www.com/products/rotatingunions.htm>.
Cameron, I., "Atomic Layer, Deposition Chamber Works at Low Temperature", 2 pages, Electronic Times, Jul. 19, 2001, <http://www.electronictimes.com/story/OEG20010719S0042>.
Cutting Edge Optronics, 600W QCW Laser Diode Array, Part No. ARR48P600, 2 pages, Oct. 2001, <www.ceolaser.com>.
Henning, A.K., et al., "Microfluidic MEMS for Semiconductor Processing," IEEE Trans. Components, Packaging, and Manufacturing Technology B21, pp. 329-337, 1998.
Fitch, J.S., et al., "Pressure-Based Mass-Flow Control Using Thermopneumatically-Actuacted Microvalves," Proceedings, Sensors and Actuators Workshop, pp. 162-165 (Transducers Research Foundation, Cleveland, OH, 1998).
Henning, A.K., "Liquid and gas-liquid phase behavior in thermopneumatically actuated microvalves," Proceedings, Micro Fluidic Devices and Systems (SPIE, Bellingham, WA, 1998; A.B. Frazier and C.H. Ahn, eds.), vol. 3515, pp. 53-63.
Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).
Maillefer, D., et al., "A High-Performance Silicon Micropump for Disposable Drug Delivery Systems," pp. 413-417, IEEE, 2001.
Henning, A.K., et al., "A thermopneumatically actuated microvalve for liquid expansion and proportional control", Proceedings, TRANSDUCERS '97: 1997 International Solid State Sensors and Actuators Conference, pp. 825-828.
University of California, Berkeley, University Extension, "Atomic Layer Deposition," 5 pages, Sep. 24-25, 2001, <http://www.unex.berkeley.edu/eng/br225/1-1.html>.
Engelke, F., et al., "Determination of Phenylthiohydantoin-Amino Acids by Two-Step Laser Sesorption/Multiphoton Ionization," Analytical Chemistry, vol. 59, No. 6, pp. 909-912, Mar. 15, 1987, The American Chemical Society.
Cowin, J.P., et al., "Measurement of Fast Desorption Kinetics of D2 From Tungsten By Laser Induced Thermal Desorption," Surface Science, vol. 78, pp. 545-564, 1978, North-Holland Publishing Company.
Ready, J.F., "Effects Due to Absorption of Laser Radiation," Journal of Applied Physics, vol. 36, No. 2, pp. 462-468, Feb. 1965, Journal of Applied Physics, American Institute of Physics.

Zare, R.N., et al. "Mass Spectrometry of Molecular Adsorbates Using Laser Desorption/Laser Multiphoton Ionization," Bulletin of the Chemical Society of Japan, vol. 61, No. 1, pp. 87-92, Jan. 1988.

Tokyo Electron Limited, Plasma Process System, Trias SPA, 1 page, retrieved from the Internet on Oct. 16, 2004, <http://www.tel.com/eng/products/spe/sdtriasspa.htm>.

Olsson, A., "Valve-less Diffuser Micropumps", ISSN 0281-2878, 66 pages, 1998.

Bardell, R.L., et al., "Designing High-Performance Micro-Pumps Based on No-Moving-Parts Valves", DSC-Vol. 62/HTD-Vol. 354, Microelectromechanical Systems (MEMS) ASME 1997, pp. 47-53.

Henning, A.K., et al., "Performance of MEMS-Based Gas Distribution and Control Systems for Semiconductor Processing," Micromachined Devices and Components (SPIE, Bellingham, WA, 1998; P.J. French and K. Chau, eds.), vol. 3514, pp. 159-170.

Henning, A.K. et al., "Contamination Reduction Using MEMS-Based, High-Precision Mass Flow Controllers," Proceedings, SEMICON West Symposium on Contamination Free Manufacturing for Semiconductor Processing (SEMI, Mountain View, CA, 1998), pp. 1-11.

Henning, A.K., "Microfluidic MEMS," Proceedings, IEEE Aerospace Conference, Paper 4.906 (IEEE Press, Piscataway, NJ, 1998), 16 pages.

Peters, L., "Thermal Processing's Tool of Choice: Single-Wafer RTP or Fast Ramp Batch?" Semiconductor International, Apr. 1, 1998, 8 pages, <http://www.e-incite.net/semiconductor/index/asp?alyout=article&articleid+CA163937>.

The University of Adelaide, Australia, Department of Chemistry, "Spectroscopy", 2 pages, retrieved from the Internet on Feb. 9, 2002, <http://www.chemistry.adelaide.edu.au/external/Soc-Rel/Content/spectros.htm>.

Deublin Company, "Sealing," 2 pages, retrieved from the Internet on Feb. 4, 2002, <http://www.deublin.com/products/sealing/htm>.

Deublin Company, "Precision Rotating Connections for Water, Steam, Air, Hydraulic, Vacuum, Coolant and Hot Oil Service," 1 page, retrieved from the Internet on Feb. 4, 2002, <http://www.deublin.com>.

Integrated Process Systems Ltd., "Nano-ALD", 2 pages, retrieved from the Internet on Dec. 11, 2001, <http://www.ips-tech.com/eng/pro-p2.htm>.

Integrated Process Systems Ltd., "Welcome to IPS Ltd.", 1 page, retrieved from the Internet on Dec. 11, 2001, <http://www.ips-tech.com/eng/main.htm>.

Takahashi, K et al., "Process Integration of 3D Chip Stack with Vertical Interconnection," pp. 601-609, 2004 Electronic Components and Technology Conference, IEEE, Jun. 2004.

Aera Corporation, "Fundamentals of Mass Flow Control," 1 page, retrieved from the Internet on Mar. 6, 2003, <http://www.aeramfc.com/funda.shtml>.

EMCO Flow Systems, "Mach One Mass Flow Controllers", 1 page, retrieved from the Internet on Nov. 7, 2003, <http://emcoflow.com/mach-one.htm>.

EMCO Flow Systems, "Mach One Mass Flow Controller Product Brochure" 6 pages, retrieved from the Internet on Nov. 7, 2003, <http://www.emcoflow.com/literature/brochures_product_sheets/mach_one/mach_one_brochure_2_01.pdf>.

SemiZone, EMCO Flow Systems Granted Patent for the Mach One Mass Flow Controller for the Semiconductor Industry (Jun. 28, 2001), 2 pages. retrieved from the Internet on Nov. 7, 2003, <http://www.semizone.com/news/item?news_item_id+100223>.

* cited by examiner

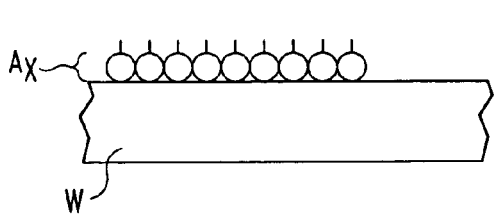
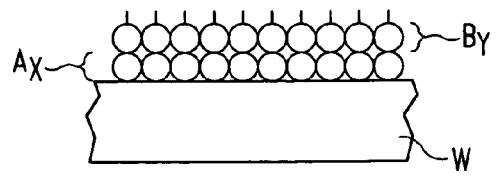
Fig. 1A
(Prior Art)
Fig. 1B
(Prior Art)
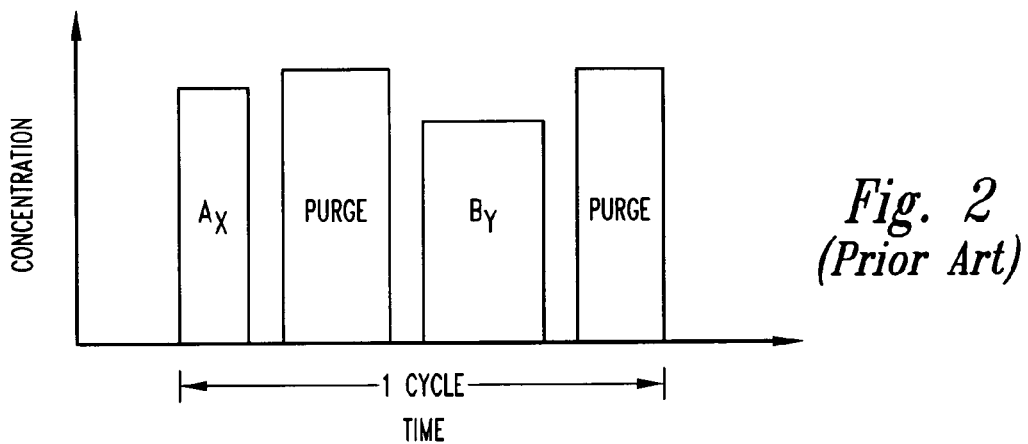
Fig. 2
(Prior Art)
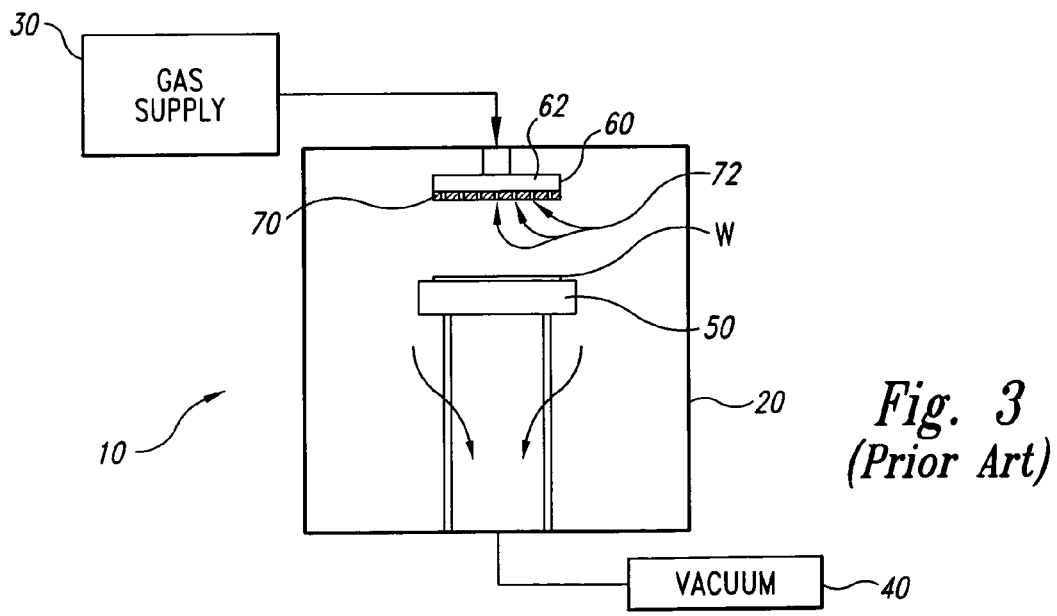
Fig. 3
(Prior Art)

SYSTEMS AND METHODS FOR DEPOSITING MATERIAL ONTO MICROFEATURE WORKPIECES IN REACTION CHAMBERS

TECHNICAL FIELD

The present invention is related to systems and methods for depositing material in thin film deposition processes used in the manufacturing of microfeatures.

BACKGROUND

Thin film deposition techniques are widely used in the manufacturing of microfeatures to form a coating on a workpiece that closely conforms to the surface topography. The size of the individual components in the workpiece is constantly decreasing, and the number of layers in the workpiece is increasing. As a result, both the density of components and the aspect ratios of depressions (i.e., the ratio of the depth to the size of the opening) are increasing. The size of workpieces is also increasing to provide more real estate for forming more dies (i.e., chips) on a single workpiece. Many fabricators, for example, are transitioning from 200 mm to 300 mm workpieces, and even larger workpieces will likely be used in the future. Thin film deposition techniques accordingly strive to produce highly uniform conformal layers that cover the sidewalls, bottoms, and corners in deep depressions that have very small openings.

One widely used thin film deposition technique is Chemical Vapor Deposition (CVD). In a CVD system, one or more precursors that are capable of reacting to form a solid thin film are mixed while in a gaseous or vaporous state, and then the precursor mixture is presented to the surface of the workpiece. The surface of the workpiece catalyzes the reaction between the precursors to form a solid thin film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within the silicon substrate at higher temperatures. On the other hand, if more reactive precursors are used so that the workpiece temperature can be lower, then reactions may occur prematurely in the gas phase before reaching the substrate. This is undesirable because the film quality and uniformity may suffer, and also because it limits the types of precursors that can be used.

Atomic Layer Deposition (ALD) is another thin film deposition technique. FIGS. 1A and 1B schematically illustrate the basic operation of ALD processes. Referring to FIG. 1A, a layer or partial layer of gas molecules $A_x$ coats the surface of a workpiece W. The layer of $A_x$ molecules is formed by exposing the workpiece W to a precursor gas containing $A_x$ molecules and then purging the chamber with a purge gas to remove excess $A_x$ molecules. This process can form a monolayer or partial monolayer of $A_x$ molecules on the surface of the workpiece W because the $A_x$ molecules at the surface are held in place during the purge cycle by physical adsorption forces at moderate temperatures or chemisorption forces at higher temperatures. Referring to FIG. 1B, the layer of $A_x$ molecules is then exposed to another precursor gas containing $B_y$ molecules. The $A_x$ molecules react with the $B_y$ molecules to form an extremely thin layer of solid material on the workpiece W. The chamber is then purged again with a purge gas to remove excess $B_y$ molecules.

FIG. 2 illustrates the stages of one cycle for forming a thin solid layer using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. In actual processing, several cycles are repeated to build a thin film on a workpiece having the desired thickness. For example, each cycle may form a layer or partial layer having a thickness of approximately 0.1-1.0 Å, and thus several cycles are required to form a solid layer having a thickness of approximately 60 Å.

FIG. 3 schematically illustrates a single-wafer ALD reactor 10 having a reaction chamber 20 coupled to a gas supply 30 and a vacuum 40. The reactor 10 also includes a heater 50 that supports the workpiece W and a gas dispenser 60 in the reaction chamber 20. The gas dispenser 60 includes a plenum 62 operably coupled to the gas supply 30 and a distributor plate 70 having a plurality of holes 72. In operation, the heater 50 heats the workpiece W to a desired temperature, and the gas supply 30 selectively injects the first precursor $A_x$, the purge gas, and the second precursor $B_y$, as shown above in FIG. 2. The vacuum 40 maintains a negative pressure in the chamber to draw the gases from the gas dispenser 60 across the workpiece W and then through an outlet of the reaction chamber 20.

One drawback of ALD processing is that it has a relatively low throughput compared to CVD techniques. For example, each $A_x$-purge-$B_y$-purge cycle can take several seconds. This results in a total process time of several minutes to form a single thin layer of only 60 Å. In contrast to ALD processing, CVD techniques require only about one minute to form a 60 Å thick layer. The low throughput of existing ALD techniques limits the utility of the technology in its current state because ALD may be a bottleneck in the overall manufacturing process.

Another drawback of ALD and pulsed CVD processing is the downtime required to service the valves that control the flow of precursor into the reaction chamber. The flow of each precursor is controlled $B_y$, a single, quick-action valve that actuates at least once per cycle to provide the precursor to the gas dispenser. For example, the valves can actuate between 100-2000 times to build a single 200 Å thick layer. Accordingly, the high frequency of actuations causes the valves to wear out relatively quickly. Replacing and servicing these valves requires downtime, increases operating costs, and causes an associated reduction in throughput. Therefore, there is a significant need to reduce the downtime for servicing components in CVD and ALD reactors.

BRIEF DESCRIPTION OF THE DRAWINGS

FIGS. 1A and 1B are schematic cross-sectional views of stages in ALD processing in accordance with the prior art.

FIG. 2 is a graph illustrating a cycle for forming a layer using ALD techniques in accordance with the prior art.

FIG. 3 is a schematic representation of a system including a reactor for depositing material onto a microfeature workpiece in accordance with the prior art.

DETAILED DESCRIPTION

A. Overview

Figure 4:
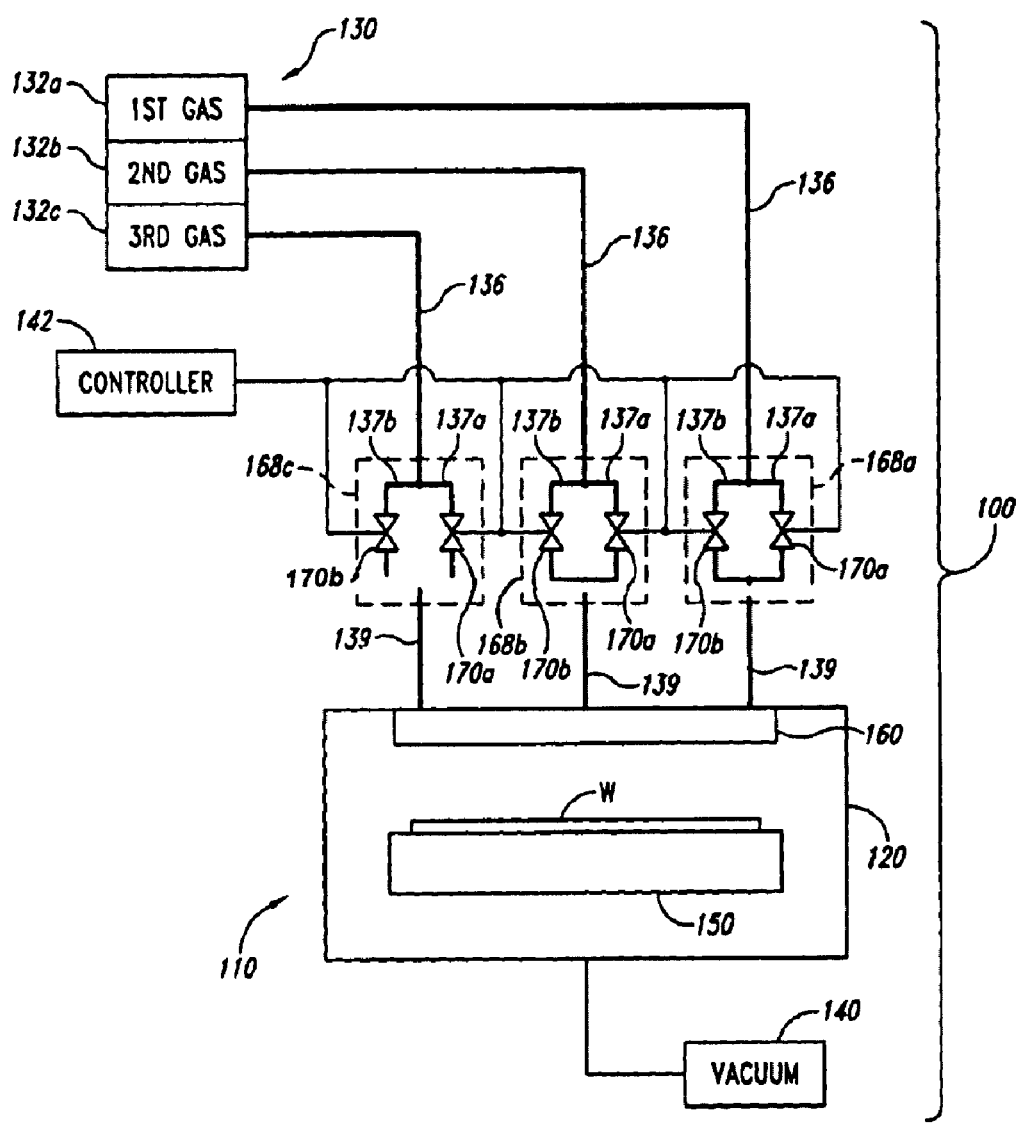
FIG. 4 is a schematic representation of a system for depositing material onto a microfeature workpiece in accordance with one embodiment of the invention.

The following disclosure describes several embodiments of systems and methods for depositing material onto microfeature workpieces in reaction chambers. Many specific details of the invention are described below with reference to single-wafer reactors for depositing material onto microfeature workpieces, but several embodiments can be used in batch systems for processing a plurality of workpieces simultaneously. The term "microfeature workpiece" is used throughout to include substrates upon which and/or in which microelectronic devices, micromechanical devices, data storage elements, read/write components, and other features are fabricated. For example, microfeature workpieces can be semiconductor wafers such as silicon or gallium arsenide wafers, glass substrates, insulative substrates, and many other types of materials. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 4-6 and the following text to provide a thorough understanding of particular embodiments of the invention. A person skilled in the art will understand, however, that the invention may have additional embodiments, or that the invention may be practiced without several of the details of the embodiments shown in FIGS. 4-6.

One aspect of the invention is directed to a system for depositing material onto a microfeature workpiece in a reaction chamber. In one embodiment, the system includes a gas supply assembly having a first gas source, a first gas conduit coupled to the first gas source, a first valve assembly, a reaction chamber, and a gas distributor carried by the reaction chamber. The first valve assembly includes first and second valves that are in fluid communication with the first gas conduit. The first and second valves are configured in a parallel arrangement so that the first gas flows through the first valve and/or the second valve.

In one aspect of this embodiment, the system further includes a controller configured to operate the first and second valves simultaneously or in an alternating sequence. In another aspect of this embodiment, the first valve assembly further includes first and second gas passageways in fluid communication with the first gas conduit. The first valve can be configured to control the first gas flow through the first passageway, and the second valve can be configured to control the first gas flow through the second passageway. In another aspect of this embodiment, the first valve assembly further includes a third valve in fluid communication with the first gas conduit. The first, second, and third valves can be arranged symmetrically so that the first, second, and third valves are spaced apart from a portion of the gas distributor by at least approximately the same distance.

In another embodiment, the system includes a gas supply assembly having a first gas source, a first gas conduit coupled to the first gas source, a first valve and a second valve each in fluid communication with the first gas conduit, a reaction chamber, and a gas distributor carried by the reaction chamber. The first and second valves are operable independently to individually and/or jointly provide pulses of the first gas downstream from the first and second valves. The gas distributor is in fluid communication with the first and second valves to receive the pulses of the first gas.

In another embodiment, the system includes a gas supply assembly having a first gas source, a first gas conduit coupled to the first gas source, a valve assembly, a reaction chamber, and a gas distributor carried by the reaction chamber. The valve assembly includes a body with first and second gas passageways, a first valve stem configured to control the flow of the first gas through the first gas passageway, and a second valve stem configured to control the flow of the first gas through the second gas passageway. The first and second gas passageways are in fluid communication with the first gas conduit and are configured in a parallel arrangement.

Another aspect of the invention is directed to a method of depositing material onto a microfeature workpiece in a reaction chamber. In one embodiment, the method includes flowing a first pulse of a first gas through a first gas conduit and a first valve into the reaction chamber. The method further includes flowing a second pulse of the first gas through the first gas conduit and a second valve into the reaction chamber without flowing the second pulse of the first gas through the first valve. In one aspect of this embodiment, flowing the first pulse of the first gas includes controlling the first valve to dispense the first pulse of the first gas into the reaction chamber, and flowing the second pulse of the first gas includes controlling the second valve to dispense the second pulse of the first gas into the reaction chamber.

B. Deposition Systems

FIG. 4 is a schematic representation of a system 100 for depositing material onto a microfeature workpiece W in accordance with one embodiment of the invention. In this embodiment, the system 100 includes a reactor 110 having a reaction chamber 120 coupled to a gas supply 130 and a vacuum 140. The reactor 110 also includes a gas distributor 160 coupled to the reaction chamber 120 and the gas supply 130 to dispense gas(es) into the reaction chamber 120 and onto the workpiece W.

The gas supply 130 includes a plurality of gas sources 132 (identified individually as 132a-c) and a plurality of upstream main lines 136 coupled to the gas sources 132. The gas sources 132 can include a first gas source 132a for providing a first gas, a second gas source 132b for providing a second gas, and a third gas source 132c for providing a third gas. The first and second gases can be first and second precursors, respectively. The third gas can be a purge gas. The first and second precursors are the gas and/or vapor phase constituents that react to form the thin, solid layer on the workpiece W. The purge gas can be a suitable type of gas that is compatible with the reaction chamber 120 and the workpiece W. In other embodiments, the gas supply 130 can include a different number of gas sources 132 for applications that require additional precursors or purge gases. In additional embodiments, the gas sources 132 can include one or more etchants for deposition onto a microfeature workpiece during etching.

In the illustrated embodiment, the reactor 110 also includes a workpiece support 150 to hold the workpiece W in the reaction chamber 120. In one aspect of this embodiment, the workpiece support 150 can be heated to bring the workpiece W to a desired temperature for catalyzing the reaction between the first gas and the second gas at the surface of the workpiece W. For example, the workpiece support 150 can be a plate with a heating element. The workpiece support 150, however, may not be heated in other applications.

The system 100 of the illustrated embodiment further includes a plurality of valve assemblies 168 (identified individually as 168a-c) coupled to the upstream main lines 136 and a plurality of downstream main lines 139 coupled to the valve assemblies 168 and the gas distributor 160. The valve assemblies 168 can include a plurality of branch lines 137 (identified individually as 137a-b) attached to the upstream and downstream main lines 136 and 139 and a plurality of valves 170 (identified individually as 170a-b) attached to the branch lines 137. The branch lines 137 flow the gases from the upstream main lines 136 to the downstream main lines 139, and the valves 170 control the flow of the gases through the branch lines 137. In the illustrated embodiment, the first and second valves 170a-b are configured in a parallel arrangement, and accordingly, each portion of gas flows through either the first valve 170a or the second valve 170b of the corresponding valve assembly 168. In other embodiments, such as those described below with reference to FIGS. 5 and 6, the valve assemblies can have a different configuration and/or a different number of valves. For example, several valve assemblies 168 can be combined into a single valve assembly, and/or the valve assemblies 168 can be carried by the reaction chamber 120.

The valve assemblies 168 are operated by a controller 142 that generates signals for controlling the flow of gases into the reaction chamber 120 for ALD and CVD applications. For example, the controller 142 can be programmed to operate the valve assemblies 168 to pulse the gases individually through the gas distributor 160 in ALD applications or mix selected precursors in the gas distributor 160 in CVD applications. More specifically, in one embodiment of an ALD process, the controller 142 actuates the first valve 170a of a first valve assembly 168a to dispense a pulse of the first gas (e.g., the first precursor) into the reaction chamber 120. Next, the controller 142 actuates the first valve 170a of a third valve assembly 168c to dispense a pulse of the third gas (e.g., the purge gas) into the reaction chamber 120. The controller 142 then actuates the first valve 170a of a second valve assembly 168b to dispense a pulse of the second gas (e.g., the second precursor) into the reaction chamber 120. Next, the controller 142 actuates the second valve 170b of the third valve assembly 168c to dispense a pulse of the third gas into the reaction chamber 120. In the next cycle, the process is repeated except the controller 142 actuates the second valves 170b (rather than the first valves 170a) of the first and second valve assemblies 168a-b to dispense pulses of the first and second gases into the reaction chamber 120.

In one embodiment of a pulsed CVD process, the controller 142 actuates the first valves 170a of the first and second valve assemblies 168a-b to dispense a pulse of the first and second gases (e.g., the first and second precursors) into the reaction chamber 120. Next, the controller 142 actuates the first valve 170a of the third valve assembly 168c to dispense a pulse of the third gas (e.g., the purge gas) into the reaction chamber 120. In the next cycle, the controller 142 actuates the second valves 170b (rather than the first valves 170a) of the first and second valve assemblies 168a-b to dispense a pulse of the first and second gases into the reaction chamber 120. The controller 142 then actuates the second valve 170b of the third valve assembly 168c to dispense a pulse of the third gas into the reaction chamber 120. In other embodiments, the controller 142 can actuate the valves 170 in other sequences.

One feature of the illustrated embodiment is that each gas source is coupled to a valve assembly with a plurality of valves. By coupling several valves to each gas source, the frequency with which each valve is actuated to dispense gas is reduced. For example, if each gas source is coupled to a valve assembly with two valves, the frequency that each valve is actuated may be reduced by one half. One advantage of this feature is that the life of the valve assembly is extended because the valves do not wear out as quickly. When the valves wear out or otherwise fail, the system is shut down to replace and/or service the valves. Accordingly, the system of the illustrated embodiment reduces the downtime to replace and/or service the valves and thereby increases the throughput.

In other embodiments, the controller 142 can simultaneously actuate the first and second valves 170a-b of a single valve assembly 168 to dispense a portion of the corresponding gas into the reaction chamber 120. One advantage of this arrangement is that if one valve fails, the other valve in the valve assembly will continue to dispense gas for deposition onto the workpiece W.

C. Other Valve Assemblies

Figure 5:
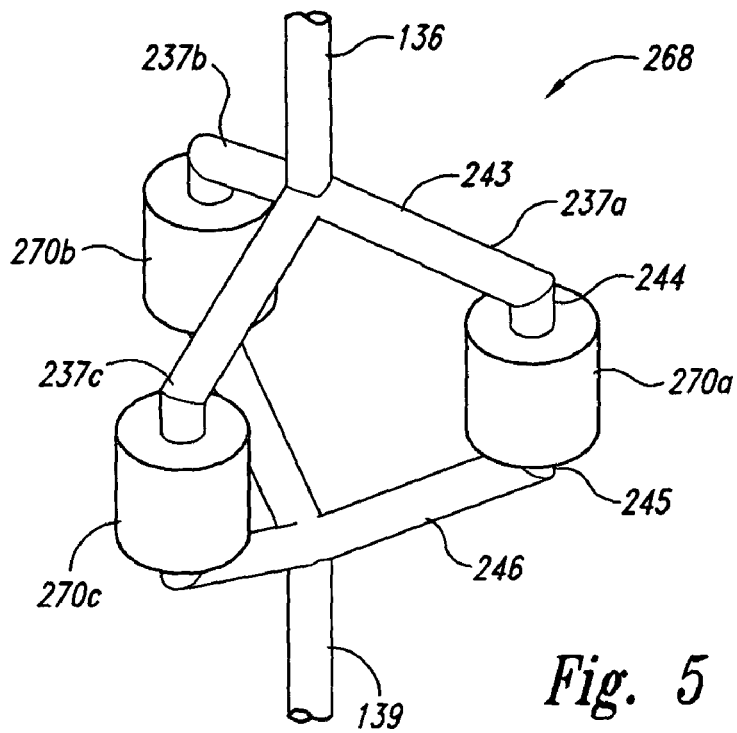
FIG. 5 is a schematic isometric view of a valve assembly for use in the system shown in FIG. 4 in accordance with another embodiment of the invention.

FIG. 5 is a schematic isometric view of a valve assembly 268 for use in the system 100 shown in FIG. 4 in accordance with another embodiment of the invention. The valve assembly 268 includes a plurality of valves 270 (identified individually as 270a-c) and a plurality of branch lines 237 (identified individually as 237a-c) coupling the valves 270 to the upstream and downstream main lines 136 and 139. In one aspect of this embodiment, the branch lines 237 and the valves 270 are arranged symmetrically so that the valves 270 provide pulses of gas to the reaction chamber 120 (FIG. 4) at a consistent pressure and with a consistent response time. For example, the branch lines 237 can include a first portion 243 coupled to the upstream main line 136, a second portion 244 coupled to the first portion 243 and the valve 270, a third portion 245 coupled to the valve 270, and a fourth portion 246 coupled to the third portion 245 and the downstream main line 139. The first portions 243 can be oriented at generally the same angle relative to the upstream main line 136, and the fourth portions 246 can be oriented at generally the same angle relative to the downstream main line 139. The second and third portions 244 and 245 can be generally parallel to the upstream and downstream main lines 136 and 139. Moreover, the portions 243, 244, 245 and 246 in each branch line 237 can have approximately the same length as the corresponding portions in the other branch lines 237. In this embodiment, the symmetric arrangement can ensure that each valve 270 provides consistent and uniform pulses of gas to the reaction chamber 120 (FIG. 4). In other embodiments, the valve assembly 268 may have other configurations, including asymmetric arrangements. For example, the valve assembly can include a body with gas passageways, such as in the embodiment described below with reference to FIG. 6, or the valve assembly can include a different number of valves.

Figure 6:
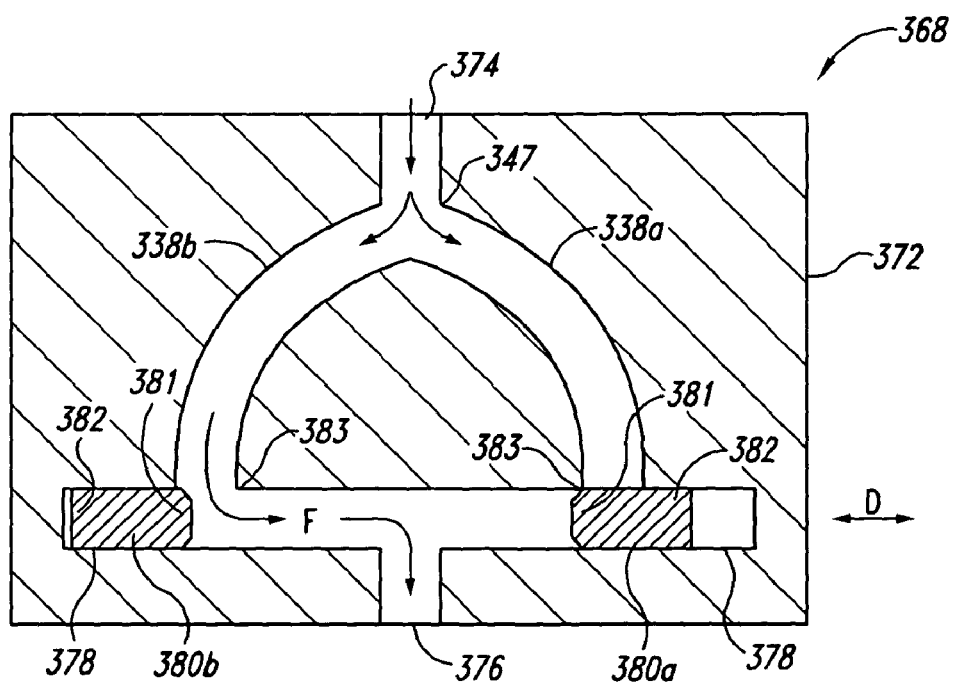
FIG. 6 is a schematic side cross-sectional view of a valve assembly for use in the system shown in FIG. 4 in accordance with yet another embodiment of the invention.

FIG. 6 is a schematic side cross-sectional view of a valve assembly 368 for use in the system 100 shown in FIG. 4 in accordance with another embodiment of the invention. The valve assembly 368 includes a valve body 372 having a first gas passageway 338a and a second gas passageway 338b, a first valve stem 380a in the valve body 372, and a second valve stem 380b in the valve body 372. The valve body 372 includes an inlet 374 configured for attachment to the upstream main line 136 (FIG. 4), an outlet 376 configured for attachment to the downstream main line 139 (FIG. 4), a plurality of valve seats 383, and a plurality of cavities 378. The first and second valve stems 380a-b include a first portion 381 configured to engage the valve seat 383 and a second portion 382 configured to be received in the cavity 378. The first and second valve stems 380a-b are movable in a direction D between a first position (illustrated by the first valve stem 380a) in which the first portion 381 engages the valve seat 383 and a second position (illustrated by the second valve stem 380b) in which the second portion 382 is received in the cavity 378. The position of the first and second valve stems 380a-b controls the flow of gas through the gas passageways 338.

In operation, a gas flow "F" enters the valve body 372 through the inlet 374 and is split into two separate flows at a junction 347 of the first and second gas passageways 338a-b. The first and second gas passageways 338a-b are configured in a parallel arrangement so that each portion of gas flows through either the first gas passageway 338a or the second gas passageway 338b. When one or both of the valve stems 380a-b are in the second position, the gas flows past the valve stems 380a-b and exits the valve body 372 through the outlet 376. In one embodiment, a controller can actuate the valve stems 380 in an alternating sequence so that when one valve stem 380 is in the second position, the other valve stem 380 is in the first position. In other embodiments, a controller can actuate the valve stems 380 simultaneously so that both of the valve stems 380 can be in the second position at the same time. In additional embodiments, the valve assembly 368 can include a different number of valve stems 380 and gas passageways 338. For example, a valve assembly can include four gas passageways and four valve stems.

From the foregoing, it will be appreciated that specific embodiments of the invention have been described herein for purposes of illustration but that various modifications may be made without deviating from the spirit and scope of the invention. Accordingly, the invention is not limited, except as by the appended claims.

We claim:

1. A method of depositing material onto a microfeature workpiece in a reaction chamber, the method comprising:
    flowing a first pulse of a first gas through a first gas conduit, a first valve, and a second gas conduit and into the reaction chamber, wherein the second gas conduit is downstream from the first valve;
    flowing a second pulse of the first gas through the first gas conduit, a second valve, and the second gas conduit and into the reaction chamber without flowing the second pulse of the first gas through the first valve; and
    flowing a third pulse of the first gas through the first gas conduit and a third valve into the reaction chamber.

2. A method for depositing material onto a microfeature workpiece in a reaction chamber, the method comprising:
    flowing a first pulse of a first gas through a first gas passageway in a valve assembly and into a first portion of a gas distributor at the reaction chamber; and
    flowing a second pulse of the first gas through a second gas passageway in the valve assembly and into a second portion of the gas distributor, wherein the first and second portions of the gas distributor are in fluid communication with each other, wherein the first and second gas passageways are configured in a parallel arrangement and are in fluid communication with a first gas conduit;
    flowing a third pulse of the first gas through a third gas passageway in the valve assembly; and
    flowing a fourth pulse of the first gas through a fourth gas passageway in the valve assembly, wherein the third and fourth gas passageways are configured in a parallel arrangement with the first and second gas passageways and are in fluid communication with the first gas conduit.

3. A method for depositing material onto a microfeature workpiece in a reaction chamber, the method comprising:
    opening a first valve to dispense a first pulse of a first gas into the reaction chamber through a first downstream main line;
    closing the first valve;
    opening a second valve to dispense a second pulse of the first gas into the reaction chamber through the first downstream main line; and
    closing the second valve, wherein the first pulse of the first gas does not pass through the second valve and the second pulse of the first gas does not pass through the first valve.

4. The method of claim 3, further comprising:
    opening a third valve to dispense a first pulse of a second gas into the reaction chamber through a second downstream main line;
    closing the third valve;
    opening a fourth valve to dispense a second pulse of the second gas into the reaction chamber through the second downstream main line; and
    closing the fourth valve, wherein the first pulse of the second gas does not pass through the fourth valve and the second pulse of the second gas does not pass through the third valve.

5. The method of claim 3 wherein closing the first valve occurs before opening the second valve.

6. The method of claim 3, further comprising:
    opening a third valve to dispense a third pulse of the first gas into the reaction chamber through the first downstream main line after closing the second valve; and
    closing the third valve.

* * * * *